(12) United States Patent
Loubet et al.

(10) Patent No.: US 9,437,504 B2
(45) Date of Patent: Sep. 6, 2016

(54) METHOD FOR THE FORMATION OF FIN STRUCTURES FOR FINFET DEVICES

(71) Applicants: STMicroelectronics, Inc., Coppell, TX (US); International Business Machines Corporation, Armonk, NY (US)

(72) Inventors: Nicolas Loubet, Guilderland, NY (US); Prasanna Khare, Schenectady, NY (US); Qing Liu, Watervliet, NY (US); Balasubramanian Pranatharthiharan, Watervliet, NY (US); Shom Ponoth, Gaithersburg, MD (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/802,407

(22) Filed: Jul. 17, 2015

(65) Prior Publication Data

US 2015/0325487 A1    Nov. 12, 2015

Related U.S. Application Data

(62) Division of application No. 13/906,505, filed on May 31, 2013, now abandoned.

(51) Int. Cl.
| | |
|---|---|
| *H01L 21/8234* | (2006.01) |
| *H01L 21/84* | (2006.01) |
| *H01L 21/8238* | (2006.01) |
| *H01L 21/762* | (2006.01) |
| *H01L 29/66* | (2006.01) |
| *H01L 21/02* | (2006.01) |
| *H01L 27/12* | (2006.01) |

(52) U.S. Cl.
CPC ....... *H01L 21/845* (2013.01); *H01L 21/02529* (2013.01); *H01L 21/02532* (2013.01); *H01L 21/76224* (2013.01); *H01L 21/823821* (2013.01); *H01L 21/823878* (2013.01); *H01L 27/1211* (2013.01); *H01L 29/6653* (2013.01); *H01L 29/6656* (2013.01)

(58) Field of Classification Search
CPC ............... H01L 21/823431; H01L 21/823821
See application file for complete search history.

(56) References Cited

U.S. PATENT DOCUMENTS

| | | |
|---|---|---|
| 8,298,954 B1 | 10/2012 | Arnold et al. |
| 2009/0101995 A1 | 4/2009 | Beintner et al. |
| 2011/0227165 A1 | 9/2011 | Basker et al. |
| 2013/0234204 A1 | 9/2013 | Kang et al. |
| 2013/0256835 A1 | 10/2013 | Di Sarro et al. |
| 2013/0320455 A1* | 12/2013 | Cappellani et al. ................. H01L 29/66795 257/368 |

* cited by examiner

*Primary Examiner* — Jae Lee
(74) *Attorney, Agent, or Firm* — Gardere Wynne Sewell LLP

(57) ABSTRACT

On a first semiconductor material substrate, an overlying sacrificial layer formed of a second semiconductor material is deposited. In a first region, a first semiconductor material region is formed over the sacrificial layer. In a second region, a second semiconductor material region is formed over the sacrificial layer. The first semiconductor material region is patterned to define a first FinFET fin. The second semiconductor material region is patterned to define a second FinFET fin. The fins are each covered with a cap and sidewall spacer. The sacrificial layer formed of the second semiconductor material is then selectively removed to form an opening below each of the first and second FinFET fins (with those fins being supported by the sidewall spacers). The openings below each of the fins are then filled with a dielectric material that serves to isolate the semiconductive materials of the fins from the substrate.

24 Claims, 9 Drawing Sheets

METHOD FOR THE FORMATION OF FIN STRUCTURES FOR FINFET DEVICES

CROSS-REFERENCE TO RELATED APPLICATIONS

This application is a divisional application from U.S. application for patent Ser. No. 13/906,505 filed May 31, 2013, now abandoned, the disclosure of which is incorporated by reference.

TECHNICAL FIELD

The present invention relates to integrated circuits and, in particular, to a process for the formation of fin structures for use in FinFET-type integrated circuit devices.

BACKGROUND

The prior art teaches the formation of integrated circuits which utilize one or more FinFET type field effect transistors. The FinFET transistor comprises a channel region which is oriented to conduct an electrical current parallel to the surface of the substrate. The channel region is provided in an elongated section of semiconductor material. The source and drain regions of the transistor are formed in the elongated section on either side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions which are separated from each other by an intermediate gate portion of the transistor gate spanning with a perpendicular orientation over the multiple elongated sections.

A FinFET transistor is created from at least one thin portion (referred to as the "fin") of semiconductor material defining the elongated section which is used to form the channel of the transistor and also its source and drain zones. This fin is typically defined by a mask that is formed on top of a monocrystalline silicon substrate at the position of the fin. The substrate material is then directionally etched where there is no mask, to a determined depth, such that the elongated section defining the fin remains under the mask and is composed of the substrate material.

In one prior art implementation, the fin of semiconductor material which is thus obtained, and which comprises the channel of the final transistor, is not electrically insulated from the active portion of the circuit substrate, which itself is also of crystalline semiconductor material. Such a FinFET device suffers from three distinct types of leakage current. A first type of leakage current can circulate between the source and drain of the finFET transistor, via the active portion of the substrate situated below the channel. This first leakage current, internal to each transistor, is not controlled by the potential applied to the transistor gate. A second type of leakage current arises because the channel of the finFET transistor is also in electrical contact with the channels of other transistors of the same conductivity type via the substrate. The second leakage current flows between transistors in the form of an inter-transistor leakage current. A third type of leakage current appears between the channel of each finFET transistor and a lower part of the substrate in response to the substrate being connected to a reference potential.

There is a need in the art for a bulk FinFET configuration which suppresses junction leakage between the source and drain.

As CMOS process technology continues to scale towards smaller and smaller dimensions, further improvement in transistor performance is needed. Those skilled in the art recognize that the use of silicon-germanium (SiGe) materials for transistor fabrication provide for a significant boost in transistor performance, especially with respect to p-channel field effect transistor devices. Indeed, the art is moving towards the use of SiGe for p-channel devices of many different types. Specific to the use of FinFET devices, those skilled in art recognize a need to form the fin of the p-channel device from a SiGe material in order to reach improved transistor performance levels over prior art Si material only devices.

SUMMARY

In an embodiment, a method comprises: on a substrate formed of a first semiconductor material and having a first region and a second region, depositing an overlying sacrificial layer formed of a second semiconductor material; forming for the first region a region of first semiconductor material over the sacrificial layer; forming for the second region a region of second semiconductor material over the sacrificial layer; patterning the region of first semiconductor material to define at least one first fin of a FinFET transistor of a first conductivity type; patterning the region of second semiconductor material to define at least one second fin of a FinFET transistor of a second conductivity type; covering each of the first and second fins with a cap and sidewall spacer; selectively removing the sacrificial layer formed of the second semiconductor material to form an opening below each of the first and second fins, each first and second fin being supported by said sidewall spacer; and filling the opening below each of the first and second fins with a dielectric material so as to isolate the first and second fins from the substrate.

In an embodiment, an apparatus comprises: a substrate formed of a first semiconductor material and having a first region and a second region; in the first region, a first dielectric pedestal with a trench on opposite sides of the first dielectric pedestal; in the second region, a second dielectric pedestal with a trench on opposite sides of the second dielectric pedestal; in the first region, a first fin of a FinFET transistor of a first conductivity type formed of a first semiconductor material over the first dielectric pedestal and insulated from the substrate by the first dielectric pedestal; and in the second region, a second fin of a FinFET transistor of a second conductivity type formed of a second semiconductor material over the second dielectric pedestal and insulated from the substrate by the second dielectric pedestal.

In an embodiment, a method for fabricating a fin of a FinFET transistor supported by a substrate formed of a first semiconductor material comprises: depositing a sacrificial layer formed of a second semiconductor material on the substrate; forming an additional layer of a third semiconductor material over the sacrificial layer; patterning the sacrificial layer and additional layer to define a fin; covering the fin with a cap and sidewall spacer; selectively removing the second semiconductor material of the sacrificial layer to form an opening below the fin so that the fin is supported by said sidewall spacer; and filling the opening with a dielectric material so as to form an insulating pedestal which isolates any semiconductor materials of the fin from the substrate.

In an embodiment, a method for fabricating a fin of a FinFET transistor supported by a substrate formed of a first semiconductor material comprises: depositing a sacrificial layer formed of a second semiconductor material on the substrate; forming an intermediate layer of a third semiconductor material over the sacrificial layer; forming an upper layer of a fourth semiconductor material over the intermediate layer; patterning the sacrificial, intermediate and upper layers to define a fin including a first region made from the sacrificial layer, a second region made from the intermediate layer and a third region made from the upper layer; covering the fin with a cap and sidewall spacer; selectively removing the first region by selectively etching the second semiconductor material to form an opening below the second region in each fin leaving portions of the sidewall spacer to support the fin; and filling the opening with a dielectric material so as to form an insulating pedestal which isolates the second and third regions of the fin from the substrate.

BRIEF DESCRIPTION OF THE DRAWINGS

For a better understanding of the embodiments, reference will now be made by way of example only to the accompanying figures in which.

DETAILED DESCRIPTION

Reference is now made to FIGS. 1-18 which illustrate the process steps in the formation of fins for a FinFET device on a bulk substrate.

Figure 1:
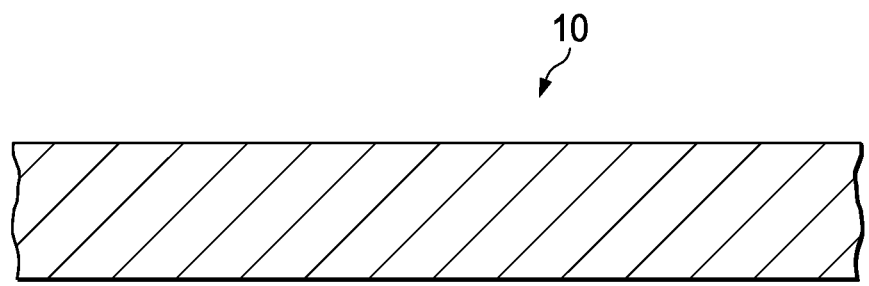
FIGS. 1-18 illustrate process steps in the formation of fins for a FinFET device on a bulk substrate.

FIG. 1 shows a conventional bulk silicon substrate wafer 10.

Figure 2:
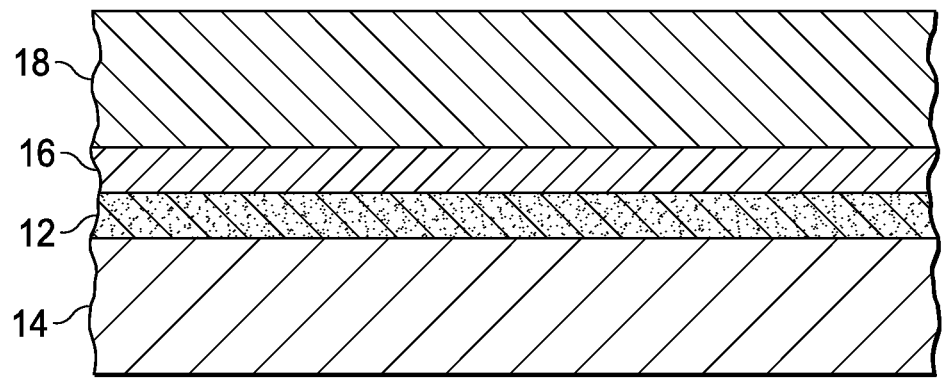

Using an epitaxial process tool, an epitaxial growth process as known in the art is performed to grow a silicon-germanium (SiGe) layer 12 on a silicon substrate 14 of the bulk silicon substrate wafer 10. The thickness of the silicon-germanium (SiGe) layer 12 is about 10 nm to 30 nm. The silicon-germanium (SiGe) layer 12 is a sacrificial layer to be replaced by an insulative dielectric material as will be described in more detail below. Without removing the substrate wafer 10 from the epitaxial process tool, an epitaxial growth process as known in the art is then performed to grow a silicon-carbide (SiC) layer 16 on the silicon-germanium (SiGe) layer 12. The thickness of the silicon-carbide (SiC) layer 16 is about 10 nm to 20 nm. Without removing the substrate wafer 10 from the epitaxial process tool, an epitaxial growth process as known in the art is then performed to grow a silicon (Si) layer 18 on the silicon-carbide (SiC) layer 16. The thickness of the silicon (Si) layer 18 is about 30 nm to 40 nm. The structure resulting from the foregoing epitaxial growth processes is shown in FIG. 2. The stippling in FIG. 2 is provided to differentiate SiGe material from Si material. The silicon-germanium (SiGe) layer 12, silicon-carbide (SiC) layer 16 and silicon (Si) layer 18 may be doped as needed for the integrated circuit application.

Figure 3:
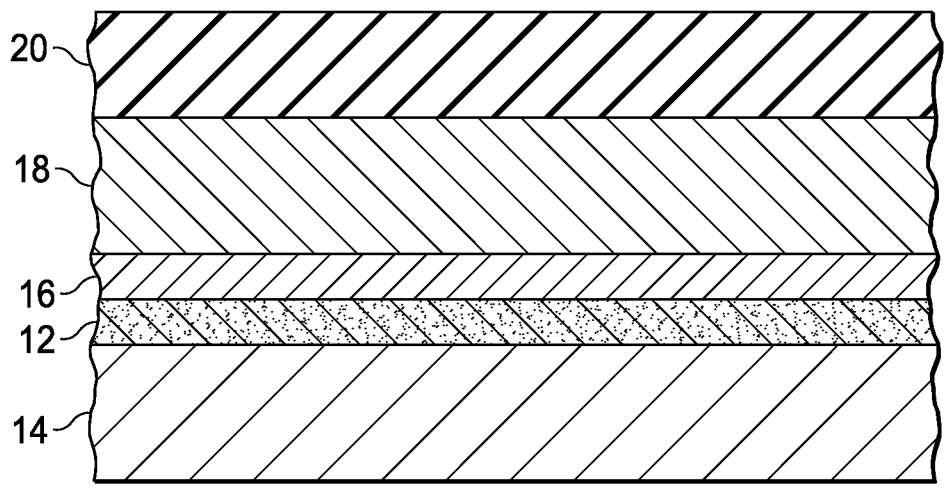

FIG. 3 shows the deposit of a silicon nitride (SiN) layer 20 over the silicon (Si) layer 18.

Figure 4:
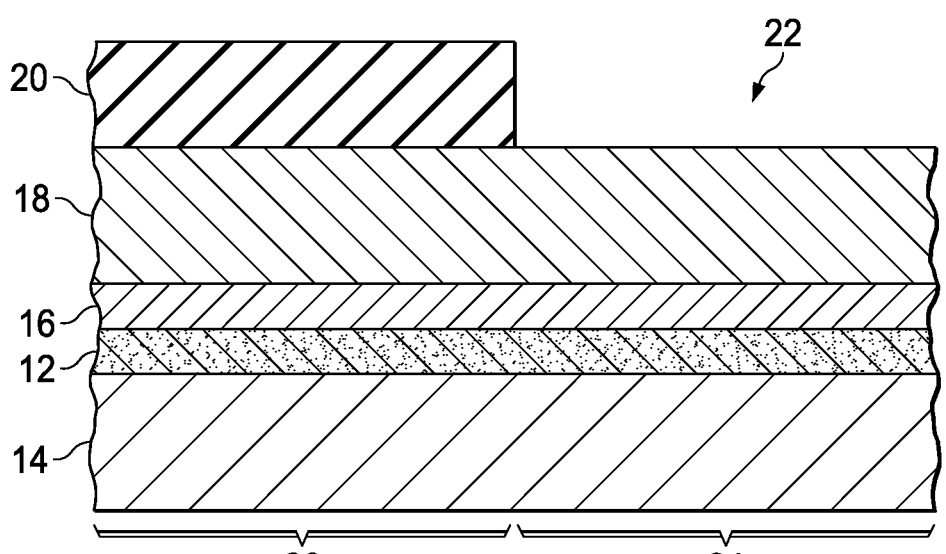

A lithographic process as known in the art is then used to form an opening 22 in the silicon nitride (SiN) layer 20 which extends down to reach at least the top surface of the silicon (Si) layer 18. The result of the lithographic process is shown in FIG. 4. The opening 22 is associated with a region 24 of the substrate wafer 10 reserved for the formation of p-channel FinFET devices. The region 26 of the substrate wafer 10 is conversely reserved for the formation of n-channel FinFET devices. Thus, the process described and illustrated primarily concerns the formation of CMOS type integrated circuits, although it will be understood that this is not the only application of the described process. In plan view, the opening 22 may take on any desired shape governed by the size and number of p-channel devices to be formed within the region 24.

Using an epitaxial process tool, a high pressure directional etch process (such as an RIE process) as known in the art is then performed to remove a portion 28 of the silicon (Si) layer 18 within the region 24 down to the silicon-carbide (SiC) layer 16. In an embodiment, the directional etch may comprise a high pressure HCl etch. The result of the directional etch process is shown in FIG. 5.

Figure 5:
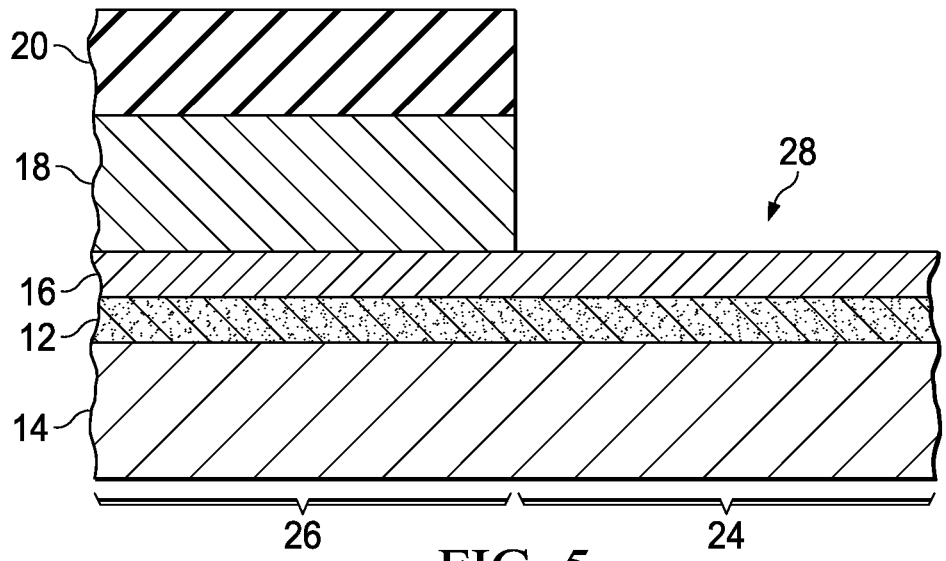
Figure 6:
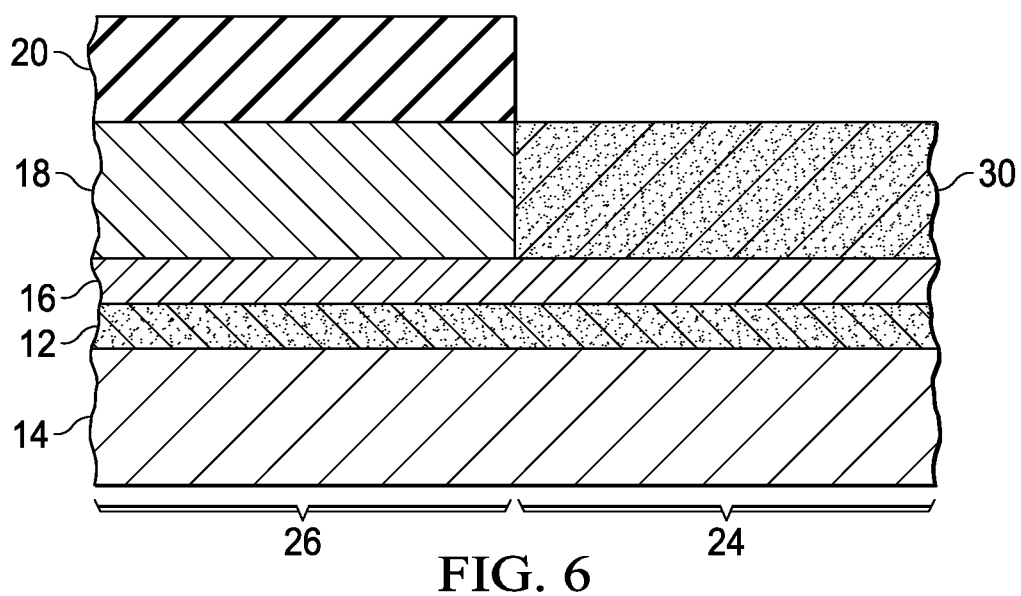

Without removing the substrate 10 from the epitaxial process tool used for the etch of FIG. 5, an epitaxial growth process as known in the art is then performed to grow a silicon-germanium (SiGe) layer 30 on top of the silicon-carbide (SiC) layer 16 in region 24 to fill the portion 28 of the silicon (Si) layer 18 that was previously removed. The result of the epitaxial growth process is shown in FIG. 6. The stippling in FIG. 6 is provided to differentiate SiGe material from Si material. The thickness of the silicon-germanium (SiGe) layer 30 in region 24 is preferably at least the thickness of the silicon (Si) layer 18 in the adjacent region 26. The silicon nitride (SiN) layer 20 is then removed.

Figure 7:
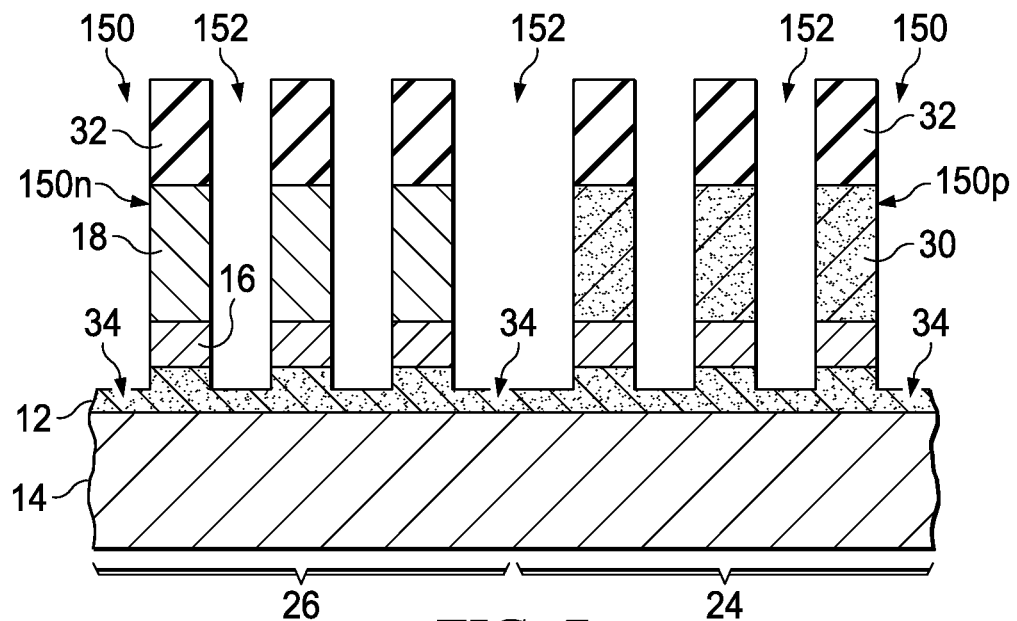

A lithographic process as known in the art is then used to define the fins 150 for the FinFET devices. A lithographic mask of silicon nitride (SiN) 32 is applied over the top surface of the silicon-germanium (SiGe) layer 30 in region 24 and the silicon (Si) layer 18 in region 26. The mask is patterned to leave SiN mask material at the desired locations of the fins 150. An etching operation is then performed to open apertures 152 in the silicon-germanium (SiGe) layer 30 in region 24 and in the silicon (Si) layer 18 in region 26 on either side of each fin 150. The apertures 152 further extend through the silicon-carbide (SiC) layer 16 and reach partially into the silicon-germanium (SiGe) layer 12. In a preferred implementation, a portion 34 of the (sacrificial) silicon-germanium (SiGe) layer 12 remains at the bottom of each aperture 152. The result of the etching process is shown in FIG. 7. The fins 150 include fins 150p for use in forming p-channel transistors in the region 24 and fins 150n for use in forming n-channel transistors in the region 26. The etching process used to form the fins 150 may, for example, comprise a $Cl_2$ or HBr etch as known in the art and may be performed in multiple etch steps (such as a first etch through to the silicon-carbide (SiC) layer 16 followed by a second etch through the silicon-carbide (SiC) layer 16 and into the silicon-germanium (SiGe) layer 12). Even more particularly, the etching process may utilize a sidewall image transfer (SIT) process such as that described, for example, in U.S. Pat. No. 8,298,954, the disclosure of which is incorporated by reference.

Figure 8:
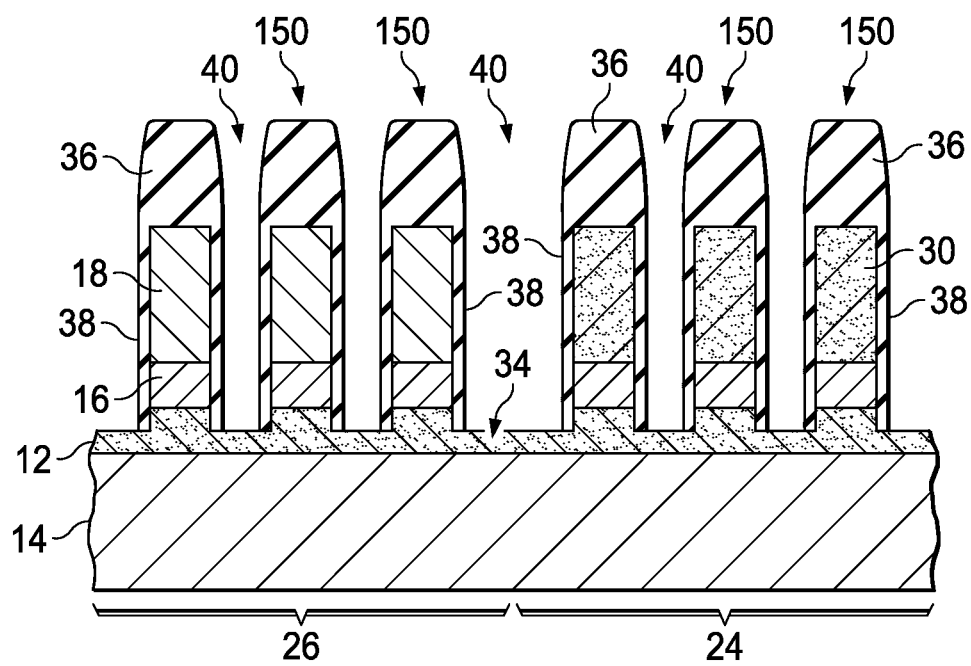

Silicon nitride (SiN) is then deposited over the fins 150. The deposited silicon nitride (SiN) is then etched (for example, using an RIE process) to remove the silicon nitride (SiN) at the portion 34 of the (sacrificial) silicon-germanium (SiGe) layer 12 between the fins 150 and thus define trenches 40 between adjacent fins 150. The result of the silicon nitride (SiN) deposit and etch process is shown in FIG. 8. Each fin 150 is now covered by silicon nitride (SiN) in the form of a thick silicon nitride (SiN) cap 36 and thin silicon nitride (SiN) sidewall spacers 38. The thin silicon nitride (SiN) sidewall spacers 38 have a thickness of 3 nm to 10 nm.

Figure 9:
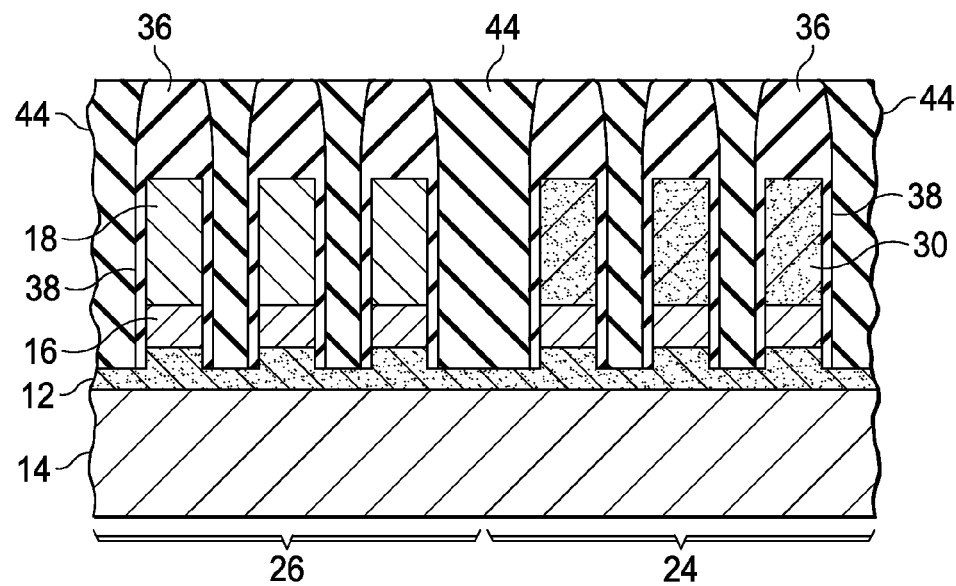

The trenches 40 are then filled with silicon dioxide (SiO$_2$) 44 and a planarization process (for example, chemical-mechanical polishing (CMP)), is used to flatten the top of the wafer. The polishing process is configured to stop at the silicon nitride (SiN) cap 36. The result of the silicon dioxide (SiO$_2$) deposit and polish process is shown in FIG. 9.

Figure 10:
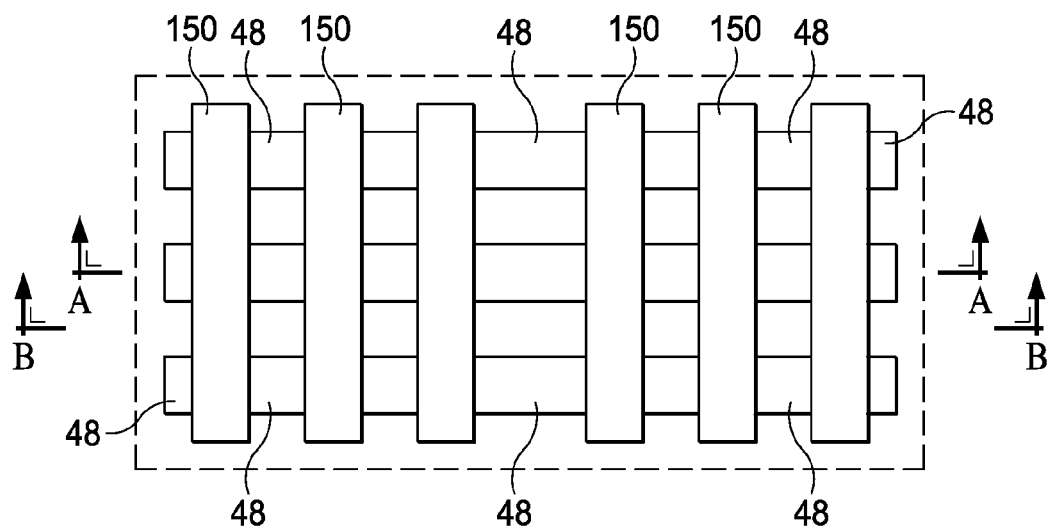

Reference is now made to FIG. 10 which illustrates a top view showing the relationship between a gate (PC) pattern and the fins 150. A PC mask in accordance with the PC pattern of FIG. 10 is applied to the wafer of FIG. 9 and an anisotropic etch of the silicon dioxide (SiO$_2$) 44 deposit is performed through the PC mask to open trenches 48 through the silicon dioxide (SiO$_2$) 44 deposit to reach the portion 34 of the silicon-germanium (SiGe) layer 12 which remained at the bottom of each aperture 152 (see, FIG. 7). The anisotropic etch is continued to extend through the silicon-germanium (SiGe) layer 12 and reach partially into the silicon substrate 14. As a result, trenches 48 are formed on opposite sides a pedestal portion 49 defined in the silicon substrate 14.

Figure 11:
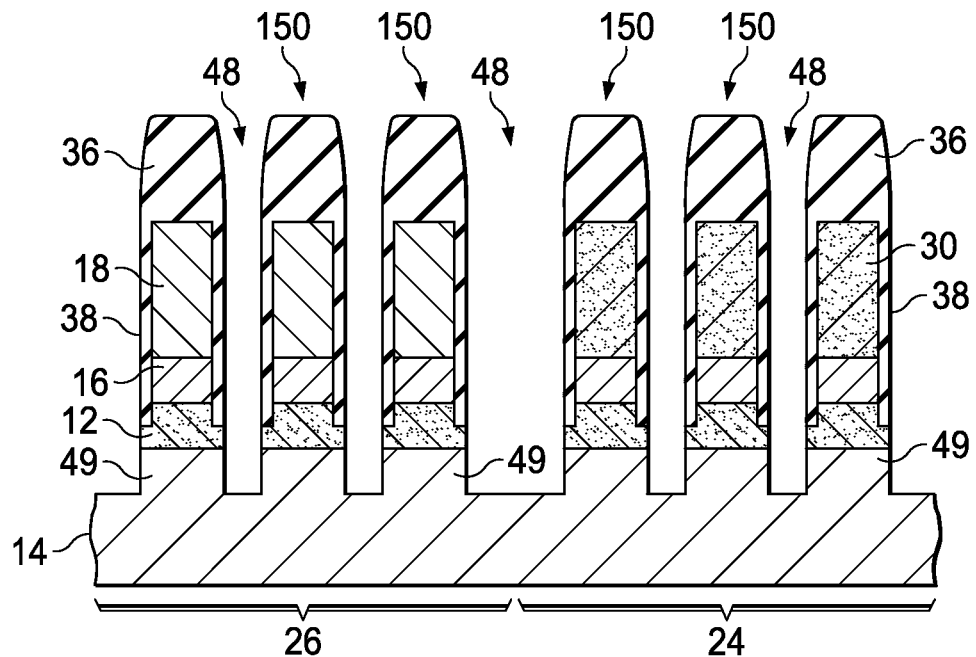

The result of the anisotropic etch is shown in FIG. 11, which illustrates a cross-section taken along lines A-A of FIG. 10. FIG. 9 illustrates the cross-section taken along lines B-B of FIG. 10.

Figure 12:
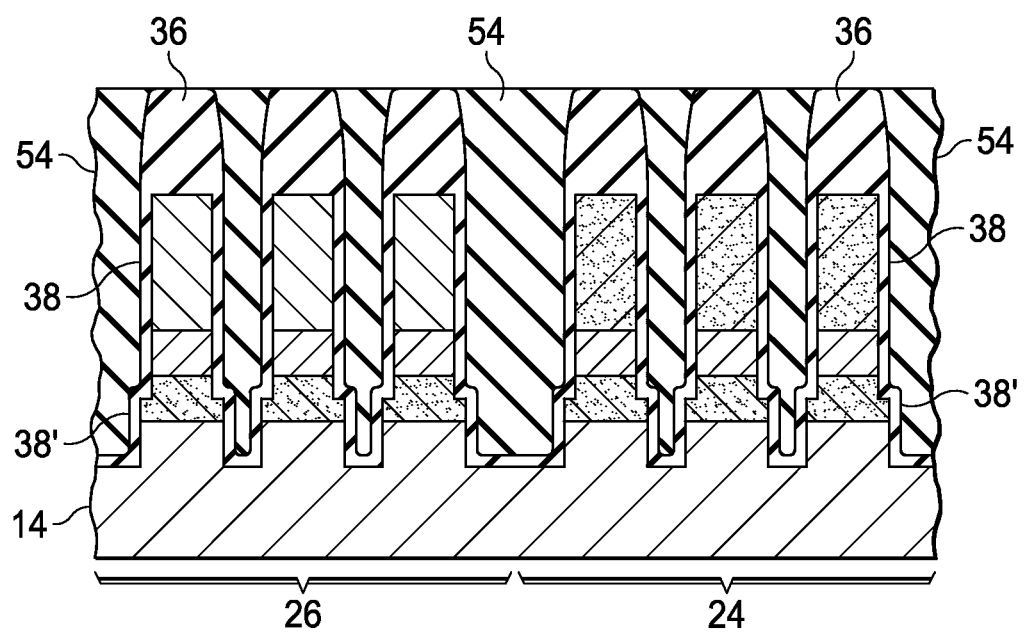

A conformal silicon nitride (SiN) deposit is then made within each open trench 48 to cover exposed side surfaces of each fin 150 and the exposed silicon substrate 14 at the bottom of each open trench 48. The result of this deposit is to extend (reference 38') the thin silicon nitride (SiN) sidewall spacers 38 over the portions of the silicon-germanium (SiGe) layer 12 and silicon substrate 14 exposed by the anisotropic etch performed in connection with FIGS. 10 and 11 to produce open trenches 48. The thin silicon nitride (SiN) sidewall spacers 38 have a thickness of 6 nm to 12 nm and the extensions 38' have a thickness of 3 nm to 8 nm. The trenches 48 are then filled with silicon dioxide (SiO$_2$) 54 and a planarization process (for example, chemical-mechanical polishing (CMP)), is used to flatten the top of the wafer. The polishing process is configured to stop at the silicon nitride (SiN) cap 36. The result of the conformal silicon nitride (SiN) deposit, silicon dioxide (SiO$_2$) deposit and polish process is shown in FIG. 12 (cross-section again taken along lines A-A of FIG. 10). FIG. 9 illustrates the cross-section taken along lines B-B of FIG. 10.

The previously deposited silicon dioxide (SiO$_2$) fills (references 44 and 54) are then recessed to a depth sufficient to expose the silicon-germanium (SiGe) layer 12 at locations away from the trenches 48 which were filled by silicon dioxide (SiO$_2$) 54 (see, FIG. 11). In other words, the silicon-germanium (SiGe) layer 12 is exposed at those locations which were not covered by the thin silicon nitride (SiN) sidewall spacers 38 or extensions 38'. The process to recess is an etching process, for example of a standard dry etch type, to etch SiO$_2$. The etch is a blanket removal. The etchant may comprise SiCoNi which has a uniform etch speed across different (dense or loose) areas.

Figure 13:
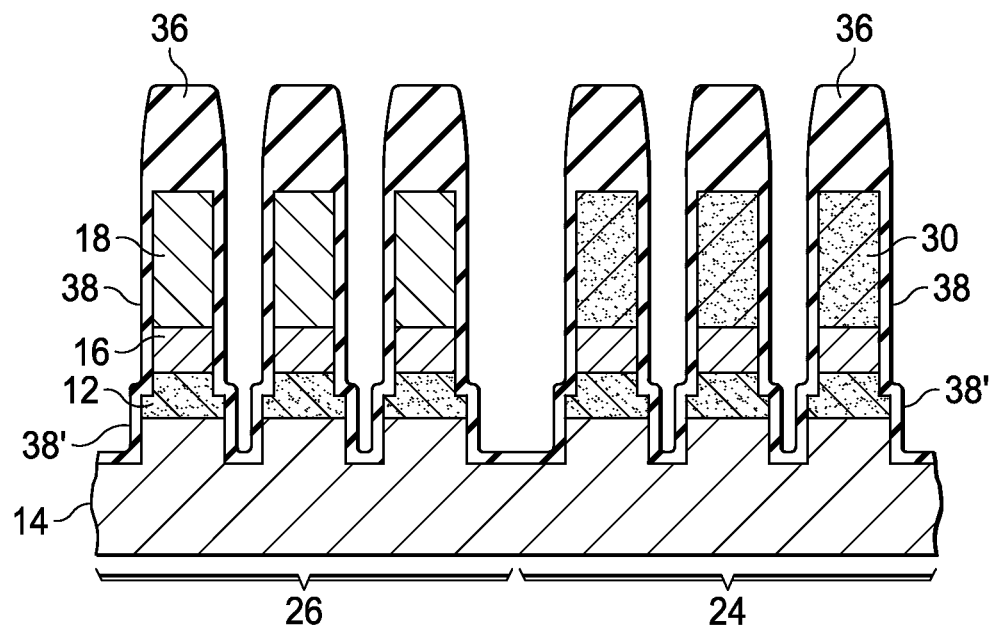
Figure 14:
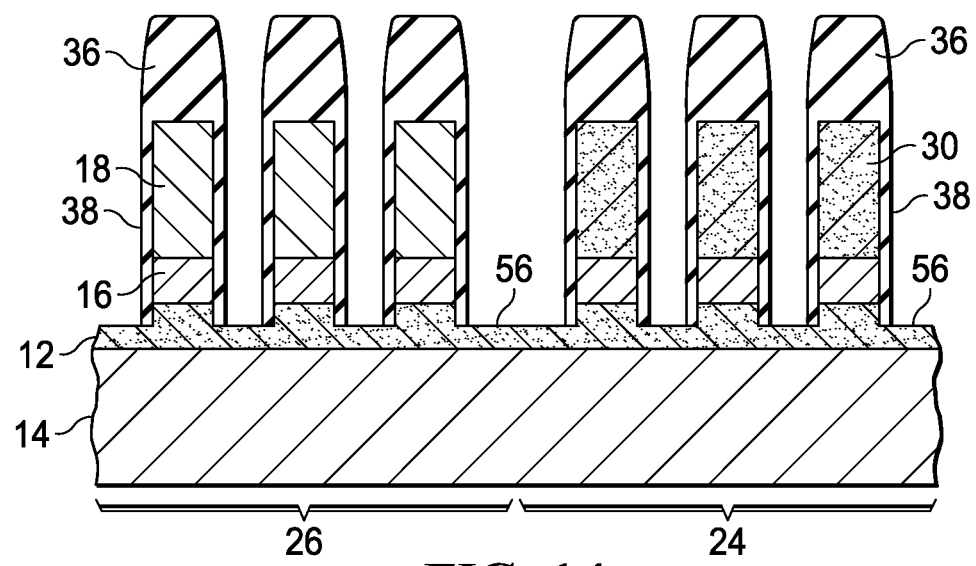

The result of the process to recess the silicon dioxide (SiO$_2$) 44 and 54 is shown in FIG. 13 (cross-section again taken along lines A-A of FIG. 10) and FIG. 14 (cross-section taken this time along lines B-B of FIG. 10). FIG. 14 shows the locations 56 where the process to recess the silicon dioxide (SiO$_2$) 44 and 54 has exposed the underlying silicon-germanium (SiGe) layer 12. Additionally, it will be noted that process to recess the silicon dioxide (SiO$_2$) 44 and 54 does not affect the silicon nitride (SiN) deposits and thus the fins 150 are protected in both FIG. 13 and FIG. 14 by the thin silicon nitride (SiN) sidewall spacers 38 and extensions 38'. The extensions 38' in FIG. 13 further cover the silicon-germanium (SiGe) layer 12 and silicon (Si) substrate 14.

Figure 15:
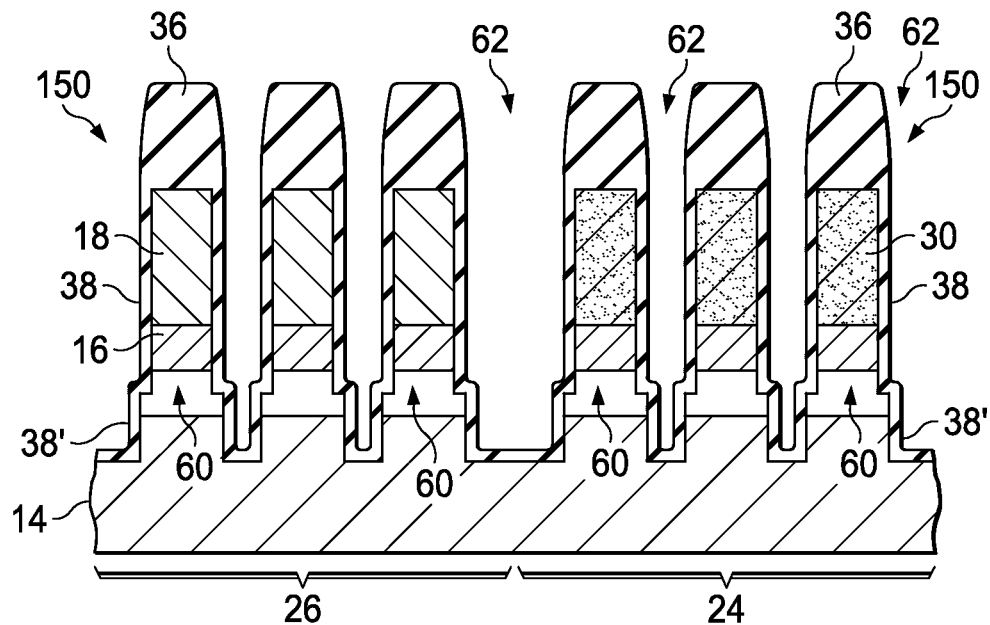
Figure 16:
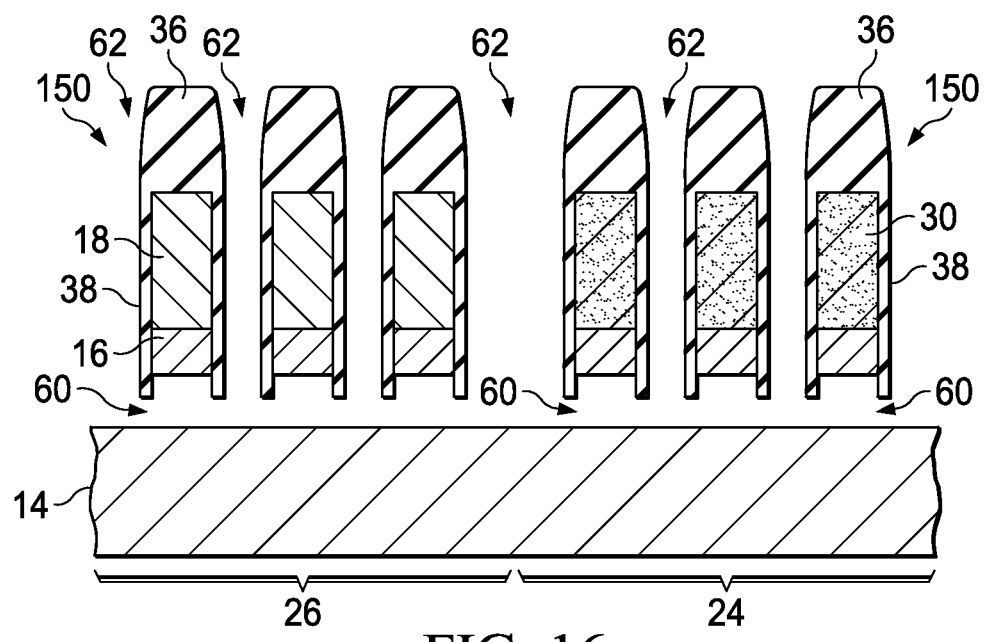

An etch process as known in the art is then performed to selectively remove the sacrificial material of the silicon-germanium (SiGe) layer 12 through the locations 56 where the silicon-germanium (SiGe) layer 12 is exposed. In an embodiment, the etch may comprise an HCl dry etch which is selective to remove SiGe and leave the adjacent Si structures in place. The result of the selective etch process is shown in FIGS. 15 and 16 (which correspond to FIGS. 13 and 14, respectively). As a result of the removal of the sacrificial silicon-germanium (SiGe) layer 12, apertures 60 are formed at the locations previously occupied by the sacrificial silicon-germanium (SiGe) layer 12. Notwithstanding the presence of apertures 60 at and under each fin 150, it will be recognized that each fin 150 continues to be structurally supported by the thin silicon nitride (SiN) sidewall spacers 38 and extensions 38'.

The silicon-carbide (SiC) material underneath the silicon-germanium (SiGe) layer 30 in region 24 serves to protect the silicon-germanium (SiGe) portion of the fins 150p from being etched away along with the sacrificial material of the silicon-germanium (SiGe) layer 12.

Figure 17:
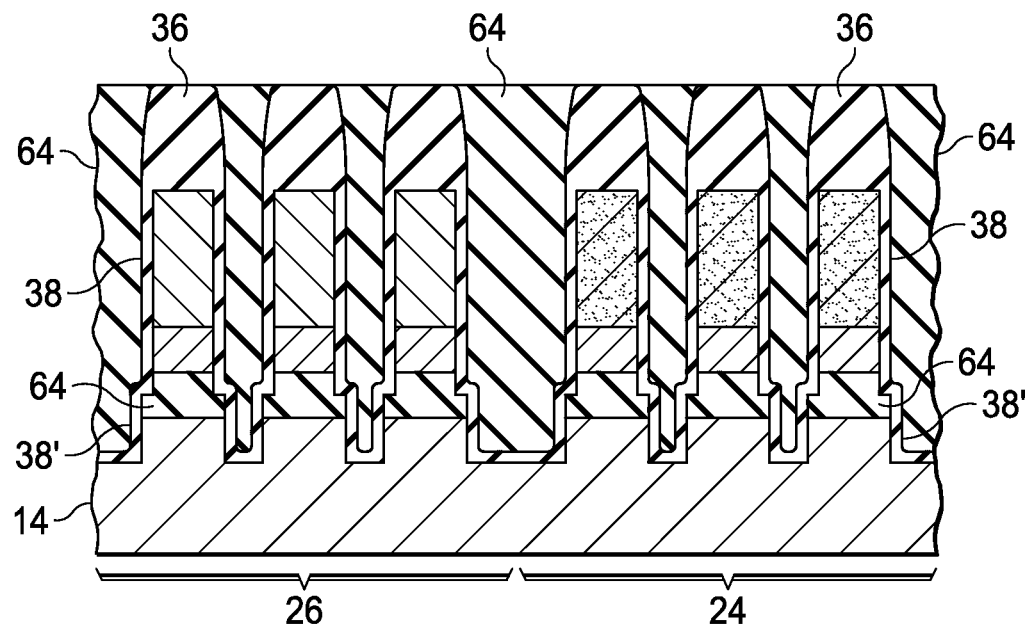

The apertures 60 under and around each fin 150 and the trenches 62 between fins 150 (FIGS. 15 and 16) are then filled with a dielectric material such as silicon dioxide (SiO$_2$) 64 and a planarization process (for example, chemical-mechanical polishing (CMP)), is used to flatten the top of the wafer. The polishing process is configured to stop at the silicon nitride (SiN) cap 36. The result of the silicon dioxide (SiO$_2$) fill and polish process is shown in FIG. 17.

Figure 18:
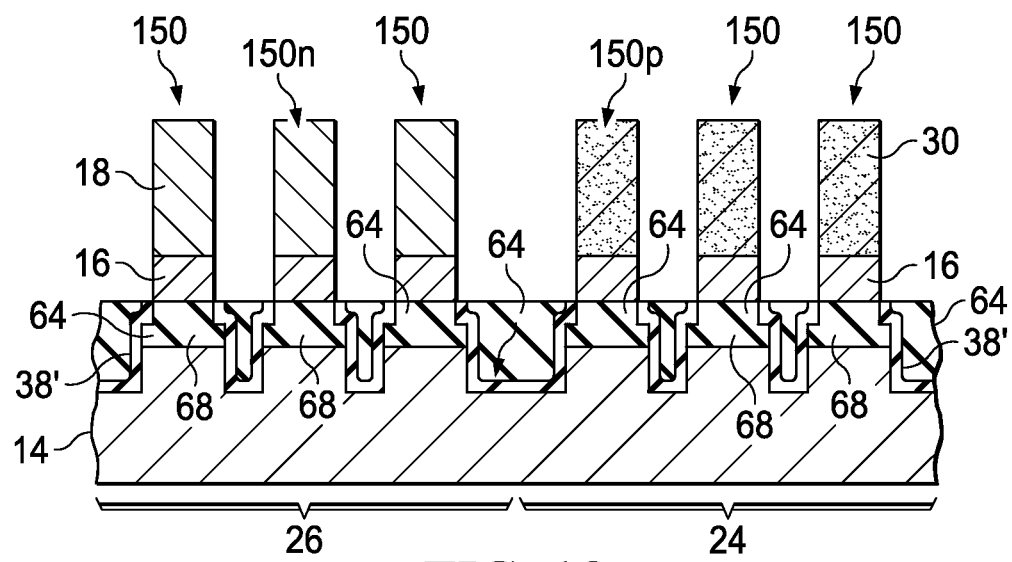

The silicon dioxide (SiO$_2$) 64 fill between the fins 150 is then recessed to a depth no lower than the bottom of the silicon-carbide (SiC) layer 16. The thick silicon nitride (SiN) cap 36 the thin silicon nitride (SiN) sidewall spacers 38 on top of and adjacent to each of the fins 150 are also removed. The result of the recess and removal process is shown in FIG. 18 wherein individual fins 150 are formed. The fins include fins 150p made of silicon-germanium from silicon-germanium (SiGe) layer 30 (in region 24) on top of silicon-carbide from silicon-carbide (SiC) layer 16 and insulated from the bulk silicon substrate 14 by the dielectric material (silicon dioxide (SiO$_2$) 64) that was filled in place of the sacrificial silicon-germanium material of the layer 12. The fins further include fins 150n made of silicon from silicon (Si) layer 18 (in region 26) on top of silicon-carbide from silicon-carbide (SiC) layer 16 and insulated from the bulk silicon substrate 14 by the dielectric material (silicon dioxide (SiO$_2$) 64) that was filled in place of the sacrificial silicon-germanium material of the layer 12. The dielectric material under each fin 150 forms a dielectric pedestal region 68 supporting the fin and insulating the fin from the bulk substrate.

Conventional semiconductor processing as known in the art may then continue from the fins 150 defined as shown in FIG. 18 to finish fabrication of FinFET devices utilizing the fins 150.

The process for fin 150 formation disclosed herein possesses a number of advantages over prior art processes for bulk substrate supported FinFET devices including: a) fin height is determined by an epitaxial growth process which results in more uniformly dimensioned fins in comparison to conventional bulk processing which may rely, for example, on a SiO$_2$ recess to define the fin dimensions; b) the fin 150n for the n-channel FinFET devices is formed of silicon (from silicon (Si) layer 18) and the fin 150p for the p-channel FinFET is formed of silicon-germanium (from the silicon-germanium (SiGe) layer 30) which promotes better transistor performance with respect to both conductivity type transistors; c) the source/drain regions of the fins 150 are isolated from the bulk silicon substrate 14 by dielectric material (from the silicon dioxide ($SiO_2$) 64 material used to fill the apertures 60 left by the removal of the sacrificial silicon-germanium (SiGe) layer 12) so as to suppress junction leakage; d) the process technique is well suited for use in aggressively scaled CMOS fabrication techniques at and below the 10nm process node; and e) the process technique is compatible with both gate first and gate last integration processing for FinFET devices.

Although this process is somewhat complex, the process provides a valuable means to produce an Si n-channel FinFET and SiGe p-channel FinFET from a bulk wafer. Bulk wafer fabrication is attractive because of a lower price point. The steps of the method are common to semiconductor fabrication and can be applied with limited cost.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
on a substrate formed of a first semiconductor material and having a first region and a second region, depositing an overlying sacrificial layer formed of a second semiconductor material;
forming for the first region a region of first semiconductor material over the sacrificial layer;
forming for the second region a region of second semiconductor material over the sacrificial layer;
patterning the region of first semiconductor material to define at least one first fin of a FinFET transistor of a first conductivity type;
patterning the region of second semiconductor material to define at least one second fin of a FinFET transistor of a second conductivity type;
covering each of the first and second fins with a cap and sidewall spacer;
selectively removing the sacrificial layer formed of the second semiconductor material to form an opening below each of the first and second fins, each first and second fin being supported by said sidewall spacer; and
filling the opening below each of the first and second fins with a dielectric material so as to isolate the first and second fins from the substrate.

2. The method of claim 1, wherein the first semiconductor material is silicon and the second semiconductor material is silicon-germanium.

3. The method of claim 2, wherein the FinFET transistor of the first conductivity type formed of the first semiconductor material is an n-channel device and wherein the FinFET transistor of the second conductivity type formed of the second semiconductor material is a p-channel device.

4. The method of claim 1, wherein the substrate is a bulk semiconductor substrate.

5. The method of claim 1, further comprising depositing an intermediate semiconductor material layer between the overlying sacrificial layer and each of the region of first semiconductor material and region of second semiconductor material.

6. The method of claim 5, wherein the intermediate semiconductor material layer is a silicon-carbide layer.

7. The method of claim 5, wherein each first fin comprises first semiconductor material over intermediate semiconductor material over said dielectric material, and each second fin comprises second semiconductor material over intermediate semiconductor material over said dielectric material.

8. The method of claim 1, further comprising removing the cap and sidewall spacer to expose each of said first and second fins.

9. The method of claim 1, wherein selectively removing the sacrificial layer formed of the second semiconductor material further forms openings adjacent each of the first and second fins, and wherein filling further comprises filling the adjacent openings with the dielectric material to separate said fins from each other.

10. The method of claim 1, further comprising defining a trench in the substrate between adjacent fins, and wherein filling further comprises filling the trench with the dielectric material.

11. The method of claim 10, wherein selectively removing the sacrificial layer formed of the second semiconductor material further forms openings adjacent each of the first and second fins, said trench in communication with said adjacent openings, and wherein filling further comprises filling the adjacent openings and trenches with the dielectric material.

12. The method of claim 11, wherein covering further comprises lining each of the trenches with said sidewall spacer.

13. A method for fabricating a fin of a FinFET transistor supported by a substrate formed of a first semiconductor material, comprising:
depositing a sacrificial layer formed of a second semiconductor material on the substrate;
forming an additional layer of a third semiconductor material over the sacrificial layer;
patterning the sacrificial layer and additional layer to define a fin;
covering the fin with a cap and sidewall spacer;
selectively removing the second semiconductor material of the sacrificial layer to form an opening below the fin so that the fin is supported by said sidewall spacer; and
filling the opening with a dielectric material so as to form an insulating pedestal which isolates any semiconductor materials of the fin from the substrate.

14. The method of claim 13, wherein the first semiconductor material is silicon and the second semiconductor material is silicon-germanium.

15. The method of claim 14, wherein the third semiconductor material is silicon carbide.

16. The method of claim 14, wherein the additional layer is a multilayer of silicon carbide and silicon, and the fin includes a silicon carbide region surmounted by a silicon region.

17. The method of claim 14, wherein the additional layer is a multilayer of silicon carbide and silicon germanium, and the fin includes a silicon carbide region surmounted by a silicon germanium region.

18. The method of claim 13, wherein selectively removing the second semiconductor material of the sacrificial layer further forms openings adjacent the fin, and wherein filling further comprises filling the adjacent openings with the dielectric material to separate said fin from other fins.

19. The method of claim 13, further comprising defining a trench in the substrate on each side of the fin, and wherein filling further comprises filling the trench on each side with the dielectric material.

20. The method of claim 19, further comprising lining each trench with an insulating layer forming an extension of said sidewall spacer.

21. The method of claim 13, wherein the substrate is a bulk semiconductor substrate.

22. A method for fabricating a fin of a FinFET transistor supported by a substrate formed of a first semiconductor material, comprising:
depositing a sacrificial layer formed of a second semiconductor material on the substrate;
forming an intermediate layer of a third semiconductor material over the sacrificial layer;
forming an upper layer of a fourth semiconductor material over the intermediate layer;
patterning the sacrificial, intermediate and upper layers to define a fin including a first region made from the sacrificial layer, a second region made from the intermediate layer and a third region made from the upper layer;
covering the fin with a cap and sidewall spacer;
selectively removing the first region by selectively etching the second semiconductor material to form an opening below the second region in each fin leaving portions of the sidewall spacer to support the fin; and
filling the opening with a dielectric material so as to form an insulating pedestal which isolates the second and third regions of the fin from the substrate.

23. The method of claim 22, wherein the first semiconductor material is silicon, the second semiconductor material is silicon-germanium and the third semiconductor material is silicon carbide.

24. The method of claim 23, wherein the fourth semiconductor material is selected from the group consisting of silicon and silicon germanium.

* * * * *